US008253508B2

(12) United States Patent
Bostak et al.

(10) Patent No.: US 8,253,508 B2
(45) Date of Patent: Aug. 28, 2012

(54) MODULATOR DRIVER CIRCUIT HAVING CHIRPED COMPONENTS

(75) Inventors: Jeffrey S. Bostak, San Martin, CA (US); Vincent G. Dominic, Dayton, OH (US); Parmijit Samra, Fremont, CA (US); Michael Kauffman, Campbell, CA (US)

(73) Assignee: Infinera Corporation, Sunnyvale, CA (US)

( * ) Notice: Subject to any disclaimer, the term of this patent is extended or adjusted under 35 U.S.C. 154(b) by 452 days.

(21) Appl. No.: 12/465,607

(22) Filed: May 13, 2009

(65) Prior Publication Data

US 2010/0289594 A1 Nov. 18, 2010

(51) Int. Cl.
*H03C 1/08* (2006.01)
(52) U.S. Cl. .......................... 332/174; 398/199
(58) Field of Classification Search .................. 398/199; 332/174
See application file for complete search history.

(56) References Cited

U.S. PATENT DOCUMENTS

| | | | | |
|---|---|---|---|---|
| 5,028,890 A | * | 7/1991 | Larson | 332/160 |
| 5,663,823 A | * | 9/1997 | Suzuki | 398/161 |
| 5,717,343 A | * | 2/1998 | Kwong | 326/27 |
| 5,745,613 A | * | 4/1998 | Fukuchi et al. | 385/24 |
| 6,490,044 B1 | * | 12/2002 | Koch et al. | 356/478 |
| 6,661,974 B1 | * | 12/2003 | Akiyama et al. | 398/95 |

\* cited by examiner

*Primary Examiner* — Joseph Chang
(74) *Attorney, Agent, or Firm* — Ross M. Carothers; David L. Soltz

(57) ABSTRACT

Embodiments of the present invention provide arrays of electrical circuits having one or more chirped elements or components for providing output signals to corresponding arrays of electro-optic devices. Certain embodiments of the present invention include a plurality of modulator driver circuits, each of the plurality of driver circuits configured to be substantially identical to each other and provide a corresponding one of a plurality of modulator drive signals to a respective one of a plurality of electro-optic modulators, each of the plurality of modulator driver circuits being chirped to provide a desired output to the corresponding electro-optic modulator for enhanced operation. Each of the plurality of modulator driver circuits comprises a plurality of electrical components, at least one of the electrical components being chirped such that a design or operating parameter of the electrical component differs from an electrical component having a similar function in at least one of the remaining modulator driver circuits of the plurality of driver circuit. In certain embodiments, each of the plurality of modulator driver circuits is provided on a common substrate.

19 Claims, 6 Drawing Sheets

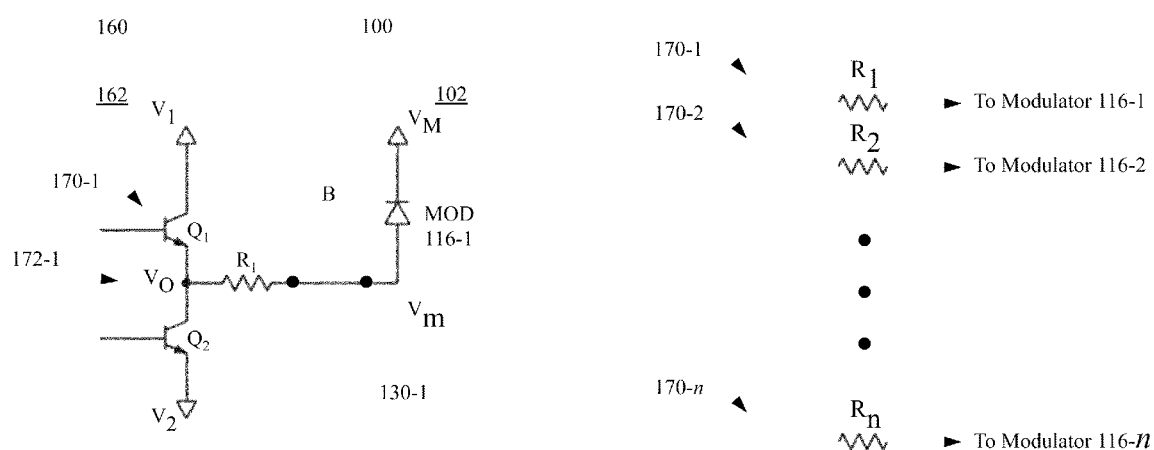
FIG. 4                    FIG. 5

MODULATOR DRIVER CIRCUIT HAVING CHIRPED COMPONENTS

BACKGROUND OF THE INVENTION

1. Field of the Invention

This invention relates generally to electrical circuits for providing operating signals to electro-optic devices in a photonic integrated circuit and, more particularly, to arrays of such electrical circuits to provide such operating signals to corresponding arrays of optical devices. Preferably the electrical circuits are provided on a single substrate.

2. Description of the Related Art

Optical circuits, and the corresponding electrical circuits which support such optical circuits, have become commonplace in the formation of a digital network infrastructure utilized for data transport as the need for increased network carrying capacity continues to grow. Such optical circuits, for example, may include arrays of optical signal paths, each signal path having multiple electro-optic devices including, but not limited to, laser sources, modulated laser sources, modulators, amplifiers, attenuators, and monitoring devices, all preferably provided on a common substrate. Examples of such photonic integrated circuits can be found in U.S. Pat. No. 7,283,694, entitled "TRANSMITTER PHOTONIC INTEGRATED CIRCUITS (TXPIC) AND OPTICAL TRANSPORT NETWORKS EMPLOYING TXPICS," and U.S. Pat. No. 7,116,851, entitled "AN OPTICAL SIGNAL RECEIVER, AN ASSOCIATED PHOTONIC INTEGRATED CIRCUIT (RxPIC), AND METHOD IMPROVING PERFORMANCE," both of which are incorporated herein in their entirety by reference.

Due to certain systematic performance variations of such monolithic photonic integrated circuits, optical signals output from photonic integrated circuits may have undesirable optical characteristics. Certain remedies for such variations relative to photonic integrated circuits can be found in copending U.S. patent application Ser. No. 12/263,471, entitled "PHOTONIC INTEGRATED CIRCUITS HAVING CHIRPED ELEMENTS," sharing a common assignee with the present application, the application incorporated herein in its entirety by reference.

One typical electro-optic device in each optical signal path is an optical modulator, which modulates the optical signal in the signal path in response to a received control signal, typically referred to as a bias signal or modulator drive signal. Generally, a modulator driver circuit is coupled to the modulator and accepts a data signal as an input, e.g. a data signal carrying information to be transmitted over a network infrastructure. The modulator driver circuit, in turn, generates an output modulator drive signal to be provided to the modulator, e.g. a Mach Zehnder modulator (MZM) or a semiconductor electro-absorption modulator (EAM). In response to the output modulator drive signal the modulator then modulates the optical signal propagating in the optical signal path to facilitate optical transmission of the data signal across the network infrastructure. Notwithstanding those remedies discussed in U.S. patent application Ser. No. 12/263,471, supra, each modulator of each of the optical signal paths may require a slightly different modulation drive signal in order to provide proper modulation. While discrete modulator driver circuits can be fabricated, each specifically tailored to a particular modulator, such discrete circuits are costly and complex.

Accordingly, there is a need for a modulator driver circuit which has a simplified design that provides an improved modulator drive signal. Additionally, what is needed is an array of such modulator driver circuits, each modulator driver circuit comprising one or more electrical components, each having one or more parameters which are varied across the array of modulator driver circuits to provide a corresponding array of desired modulator drive output signals. Such an array of modulator driver circuits are preferably provided on a common substrate.

SUMMARY OF THE INVENTION

According to this disclosure, embodiments of the present invention provide arrays of electrical circuits having one or more elements or components having one or more parameters which are varied across the array for providing desired output signals to corresponding arrays of electro-optic devices. Certain embodiments of the present invention include a plurality of modulator driver circuits, each of the plurality of driver circuits configured to be substantially similar to each other and provide a corresponding one of a plurality of modulator drive signals to a respective one of a plurality of electro-optic modulators. Each of the plurality of modulator driver circuits being chirped to provide a predetermined output to the corresponding electro-optic modulator for enhanced operation. In other embodiments, each of the plurality of modulator driver circuits comprises a plurality of electrical components, at least one of the electrical components being chirped such that a design or operating parameter of the electrical component differs from the design or operating parameters of an electrical component having a similar function in at least one of the remaining modulator driver circuits of the plurality of driver circuit. In certain embodiments, each of the plurality of modulator driver circuits is provided on a common substrate.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

In the drawings wherein like reference symbols refer to like parts:

FIG. 4 is a general circuit diagram depicting a modulator driver circuit in accordance with various embodiments of the present invention.

FIG. 5 is another general circuit diagram depicting an array of modulator driver circuits in accordance with various embodiments of the present invention.

DESCRIPTION OF THE EMBODIMENTS

Figure 1:
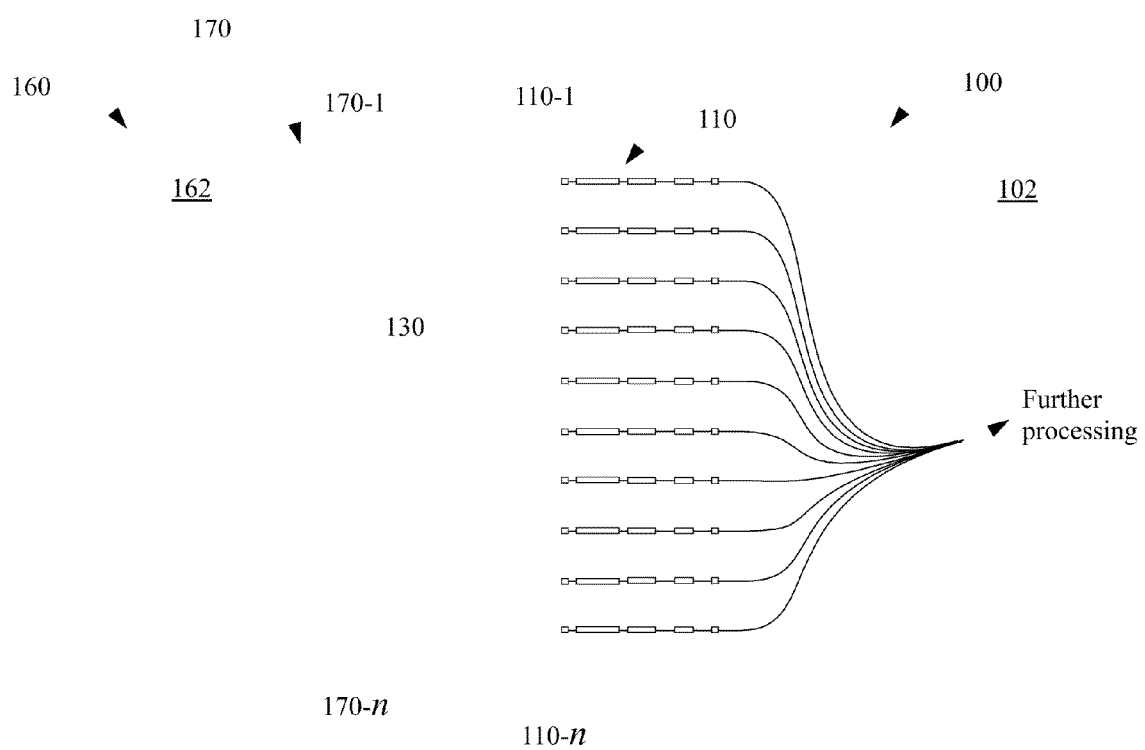
FIG. 1 is a systematic circuit diagram of an array of modulator drivers and an array of modulators provided in a corresponding one of a plurality of signal paths.

The following description is set forth for purpose of explanation in order to provide an understanding of the invention. However, it is apparent that one skilled in the art will recognize that embodiments of the present invention, some of which are described below, may be incorporated into a number of different component of the various electrical circuits which are provided to drive, or otherwise bias, one or more electro-optic components. Structures shown below in the figures are illustrative of exemplary embodiments of the invention and are meant to avoid obscuring the invention. Furthermore, connections between components within the figures are not intended to be limited to direct connections. Rather, such connections may comprise additional coupling elements or additional devices, electrical or electro-optic for example, which further modify corresponding electrical or optical signals, respectively.

Consistent with the present disclosure, electrical components are coupled together to form each of an array of electrical circuits, preferably provided on a common substrate, and parameters of each of the electrical components are "chirped" or varied across the array of electrical circuits so that an output signal from each of the array of electrical circuits has desired characteristics. As used herein, "electrical components" include, but are not limited to, resistors, capacitors, inductors, transistors, current sources, voltage sources, electrical interconnections, or other active or passive electrical devices used in modulator driver circuits in the art, or otherwise described herein. As used herein, "parameters" of an electrical component or device may comprise design parameters which may include one or more electrical characteristics of the electrical component such as resistance, capacitance, inductance, gain, e.g. provided by an active component such as a transistor, and programmable equivalent devices, such as for example, a programmable potentiometer or one or more transistors configured to provide one or more resistive values at a desired location within an electrical circuit based upon logic inputs. Additional "parameters" may also include operating parameters such as supply voltages or supply currents which power the electrical circuits comprising such electrical components. Once powered, the electrical circuits provide an output signal provided to an electro-optic device, such as an electro-optic device of an optical signal path, e.g. an output current or an output voltage having a desired waveform is provided to the electro-optic device. These parameters control or change a "characteristic" of an electrical signal associated with a circuit and, ultimately, with the output signal of such a circuit. Moreover, as used herein, a "characteristic" may include, for example, an output current, an output voltage, a rate of change associated with either the output current or output voltage, or sub-characteristics associated with such a rate of change such as overshoot, undershoot or ringing of an output voltage, or other such sub-characteristics which lead to distortions of the output current or voltage which, in turn, leads to distortions in an optical output of a corresponding electro-optic device.

Due to certain systematic performance variations, certain electro-optic elements of each signal path of a plurality of signal paths may require associated electrical circuitry having varying output signal characteristics as compared to similar electro-optic elements of other signal paths. Embodiments of the present invention provide circuitry having one or more chirped electrical elements or electrical components for providing output signals to arrays of electro-optic devices. The electro-optic devices are preferably arranged along a plurality of signal paths on a common substrate. As such, the electro-optic devices from one signal path to another, as part of the plurality of signal paths, may vary slightly, one or more electro-optical devices in one or more signal paths requiring slightly different drive signals when compared to the remaining plurality of signal paths. The driver circuitry, as part of the embodiments of the present invention, provide for multiple output drive signals, each configured to better match a electro-optic device of a given signal path amongst the plurality of signal paths.

In the various embodiments described or discussed herein, an array of modulator driver circuits is provided on a common substrate, each of the array of modulator driver circuits having one or more electrical components which are chirped to provide a corresponding one of a plurality of modulator output signals configured or adapted to drive a specific modulator of a corresponding one of the plurality of signal paths. In this way, a more efficient and cost effective photonic integrated circuit can be provided.

While the description below focuses on electrical circuitry associated with transmitter photonic integrated circuit devices, the present invention is suitable for receiver photonic integrated circuits devices as well. For example, arrays of resistors provided on a common substrate and in series with output voltages received by certain electro-optic elements, e.g. photodetectors which receive individual optical signals and convert the optical signals from the optical domain into the electrical domain, can be chirped such that an array of such resistors, cooperating with other circuitry, provides a desired attenuation of a corresponding output voltage.

Turning to FIG. 1, an exemplary transmitter photonic integrated circuit (TxPIC) 100 is depicted having a plurality of signal paths 110 formed on a common substrate 102. Although only ten signal paths 110 are depicted, the TxPIC 100 can comprise a number of signal paths n, for example from signal path 110-1 to 110-n. Each signal path provides a corresponding optical output which is then further processed, for example for transmission across a digital network infrastructure. To drive the modulator of each signal path, a corresponding array of n modulator drivers 170 is provided, as part of a electrical circuit 160. The array of modulator drivers 170, for example, is provided on a common substrate 162 as part of a integrated circuit which cooperates with other electrical components to ultimately provide a corresponding array of modulator drive signal outputs. Each of the outputs is provided to a respective one of the plurality of modulators, as part of each signal path 110 via electrical connections 130.

Figure 2:
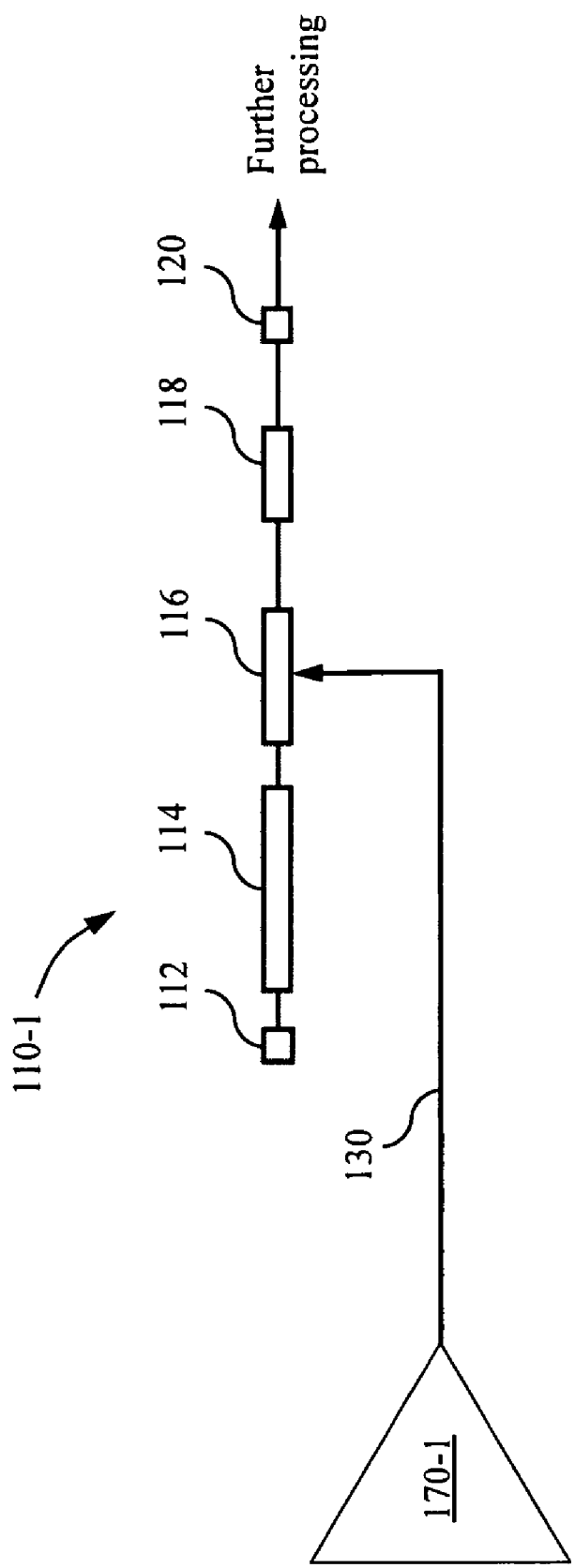
FIG. 2 is a general circuit diagram of a first path of the plurality of signal paths and a first modulator driver circuit providing a drive signal to the first path.

More specifically, with respect to FIG. 2, each exemplary signal path, such as path 110-1, comprises a plurality of electro-optic devices, of which one is a modulator. As depicted, signal path 110-1 comprises a laser source 114 for providing an optical output signal which then passes to a modulator 116, which modulates the received optical signal before passing the signal to an amplitude varying electro-optic device 118. The amplitude varying electro-optic device 118 may be, for example, an attenuator or a semiconductor optical amplifier. Optionally, the signal path may comprise further electro-optic devices 120, 112 for further amplifying or attenuating the optical signal, or for monitoring purposes to measure a characteristic of the optical signal. For example, electro-optic device 112 may be a photodiode to that senses light output from the back facet of the laser source 114. Such sensed light provides an indication of the power of the optical signal propagating in signal path 110-1. Electro-optic device 118 may also be a photodiode to monitor the first optical signal to determine whether the optical signal is at a desired power level, prior to further processing.

Figure 3A:
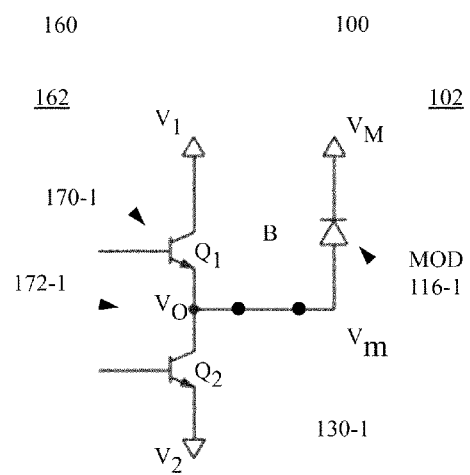
FIG. 3A is a detailed equivalent circuit diagram of a portion of the first path and a portion of the first modulator driver circuit of FIG. 2.
Figure 3B:
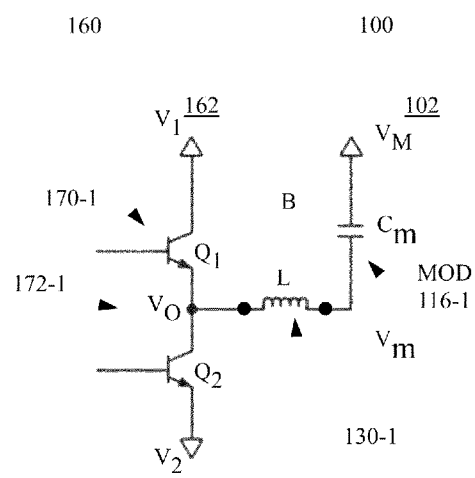
FIG. 3B is a detailed equivalent circuit diagram of certain elements of the equivalent circuit diagram of FIG. 3A.

Turning to FIGS. 3A, 3B and 4, one example of modifying a characteristic of an electrical component, common to each electrical circuit in an array of such electrical circuits, will be address in specific detail. Each of the electrical circuits is configured to provide one of a plurality of outputs, each provided to an electro-optic device of a respective one of the plurality of signal paths 110. FIG. 3A depicts a detailed equivalent circuit diagram of a portion of the first path 110-1 and a portion of the corresponding first modulator driver circuit 170-1 of FIG. 2. More specifically, an output section 172-1 of modulator driver 170-1 is configured to provide an output signal, voltage $V_O$, as an input signal, voltage $V_m$, to optical modulator 116-1 of signal path 110-1. The optical modulator 116-1 modulates a corresponding optical signal in response to the voltage $V_m$ as compared to a voltage $V_M$. As depicted, output section 172-1 comprises a first bipolar transistor $Q_1$ and a second bipolar transistor $Q_2$ arranged in a push-pull configuration. The collector of $Q_1$ receives a first voltage potential $V_1$ and the emitter of $Q_2$ receives a second voltage potential $V_2$. More information concerning the output section 172-1 can be found in U.S. Pat. No. 6,707,589, entitled "OPTICAL MODULATOR DRIVER CIRCUIT WITH LOW POWER DISSIPATION," incorporated herein in its entirety by reference. As should be apparent to one of ordinary skill in the art, the present invention is not limited to the exact configuration of the output stage 172-1 of modulator driver circuit 170-1. For example, any modulator driver circuit which includes an output signal, or a characteristic thereof, compatible with a voltage controlled electro-optic modulator would be suitable, as will be more readily understood in light of the discussion below.

Since the modulator driver circuitry 170 is provided on a first substrate 160 and the signal paths 110 of the TxPIC 100 are provided on a second substrate 100, the output signal $V_O$ is provided to modulator 116-1 via a short electrical connection 130-1 between points B, as depicted in FIG. 3A. Points B may be any suitable electrical contact point in order to make the electrical connection. As depicted in FIG. 3B, such electrical connection 130-1, although short, e.g. on the order of 1 mm to 2 mm, typically has an inductance represented by inductor L of about 75 nH, for example. The modulator 116-1 can be represented by a capacitor $C_m$ having a nominal capacitance of about 300 pF, for example, which cooperates with the inductance of inductor L to form an oscillating circuit. The oscillating circuit formed by the inductor L and modulator capacitor $C_m$ reacts to a voltage change in output voltage $V_O$, for example a voltage change from a first voltage low level to a second voltage high level, causing the output voltage to oscillate, resulting in overshoot. Such overshoot results in a an improper modulator output signal provided to the modulator 116-1 of signal path 110-1, thereby causing a distorted modulated optical signal.

Turning now to FIG. 4, a first chirped component of the modulator driver circuit 170-1 will be discussed in greater detail. As shown, in order to dampen the overshoot of the output voltage $V_O$ resulting from the oscillating circuit of the electrical connection 130-1 and the modulator 116-1, a resistor $R_1$ is positioned in series with the output voltage $V_O$ and the oscillating circuit. A resistance value of resistor $R_1$ is selected in order to adequately dampen the overshoot of the output voltage $V_O$ and, therefore, reduce ringing which may eventually lead to distortion in the corresponding modulated optical output of modulator 116-1. With reference made also to FIG. 5, a resistor may be provided as part of the corresponding modulator driver circuitry of each of the modulator drivers 170. For example, in a similar fashion to that described above with respect to modulator driver circuitry 170-1, resistor $R_2$ can be provided as part of the modulator driver circuitry 170-2 to reduce overshoot and condition the modulator driver output signal prior to providing the output signal to a second modulator 110-2 of the array of modulators 110. While the resistor $R_n$ is described as being part of the modulator driver circuitry of each of the modulator drivers 170, one of ordinary skill in the art will realize that the resistor $R_n$ can be placed external to the modulator driver circuitry, perhaps forming a part of electrical connection 130-1.

As mentioned above, each of the modulators 116 of each signal path 110 may require a slightly different bias signal for proper modulation of the corresponding optical signal propagating through the optical signal path 110. To accommodate this design need, for example, each of the plurality of resistors $R_1$ to $R_n$ can be formed, or otherwise provided, to have a resistance value further tailored to appropriately adjust the output voltage supplied to each modulator 116-1 to 116-n, respectively. Thus, the corresponding plurality of resistance values of each of the resistors $R_n$ may range from a first resistance value to a final resistance value across the plurality of modulators 116-1 to 116-n. The first resistance value, the resistance of resistor $R_1$ for example, may be greater than the final resistance value, the resistance of resistor $R_n$ for example, or less than the final resistance value. The resistance values may increase or decrease across all of the inputs of the modulators 116 with each resistor $R_n$ having a different resistance value, or across any selected number of inputs of the modulators 116. For example, the resistance values may start with a first resistance value across a first group of resistors $R_1$ through $R_3$, and then finish with a second resistance value across a remaining group of resistors $R_4$ through $R_n$. Furthermore, the resistance values of resistor $R_n$ across the inputs of modulators 116 may follow a more seemingly random pattern across the inputs of the modulators 116, each resistance value of a corresponding resistor $R_n$ selected to cooperate with the corresponding modulator 116-n to achieve a desired modulated optical output signal. For illustration purposes only, the resistance values $R_n$ may range from about 0 ohms to about 100 ohms, such that in the example immediately above the first group of resistors may have a resistance value of about 5 ohms and the second group of resistors may have a resistance value of about 20 ohms. Alternatively, the first group of resistors may have a resistance value of about 20 ohms and the second group of resistors may have a resistance value of about 5 ohms. As mentioned above, preferably such an array of modulator driver circuits, as well as the resistors $R_n$, are formed on a common substrate.

Figure 6:
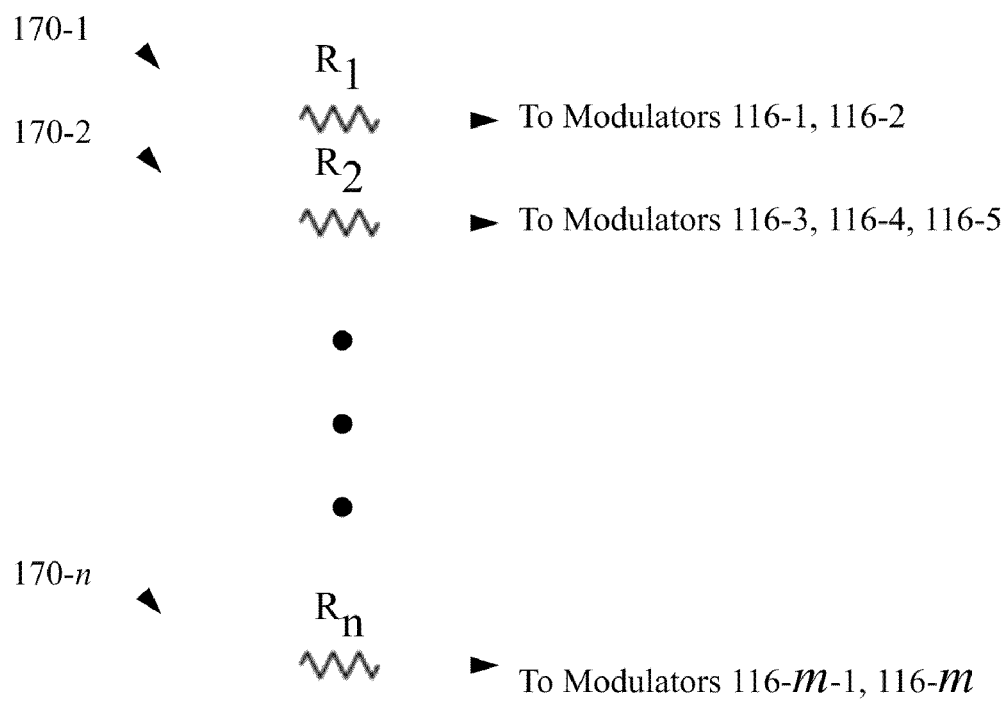
FIG. 6 is yet another general circuit diagram depicting an array of modulator driver circuits in accordance with various embodiments of the present invention.

While the above discussion is directed to a single modulator circuit 170-n of n modulators driving a corresponding one of n modulators 116-1 to 116-n, a single modulator circuit 170-n can be configured to drive multiple modulators, as depicted in FIG. 6. More specifically, modulator driver circuitry 170-1 including resistor $R_1$ can be configured to drive multiple modulators 116, for example modulators 116-1 and 116-2, of a total of m modulators where m is greater than n. The resistance value of resistor $R_1$ is, therefore, provided taking into account the circuitry of both modulators 116-1 and 116-2, as well as the oscillating circuit comprising the capacitance of the equivalent circuit for modulators 116-1 and 116-2, in series with the modulator driver output voltage $V_O$ via resistor $R_1$. The remaining resistors $R_1$ to $R_n$ are fabricated in similar fashion to provide desired modulator output signals which can more effectively drive the corresponding multiple modulators 116-2 to 116-m electrically coupled thereto.

Figure 7:
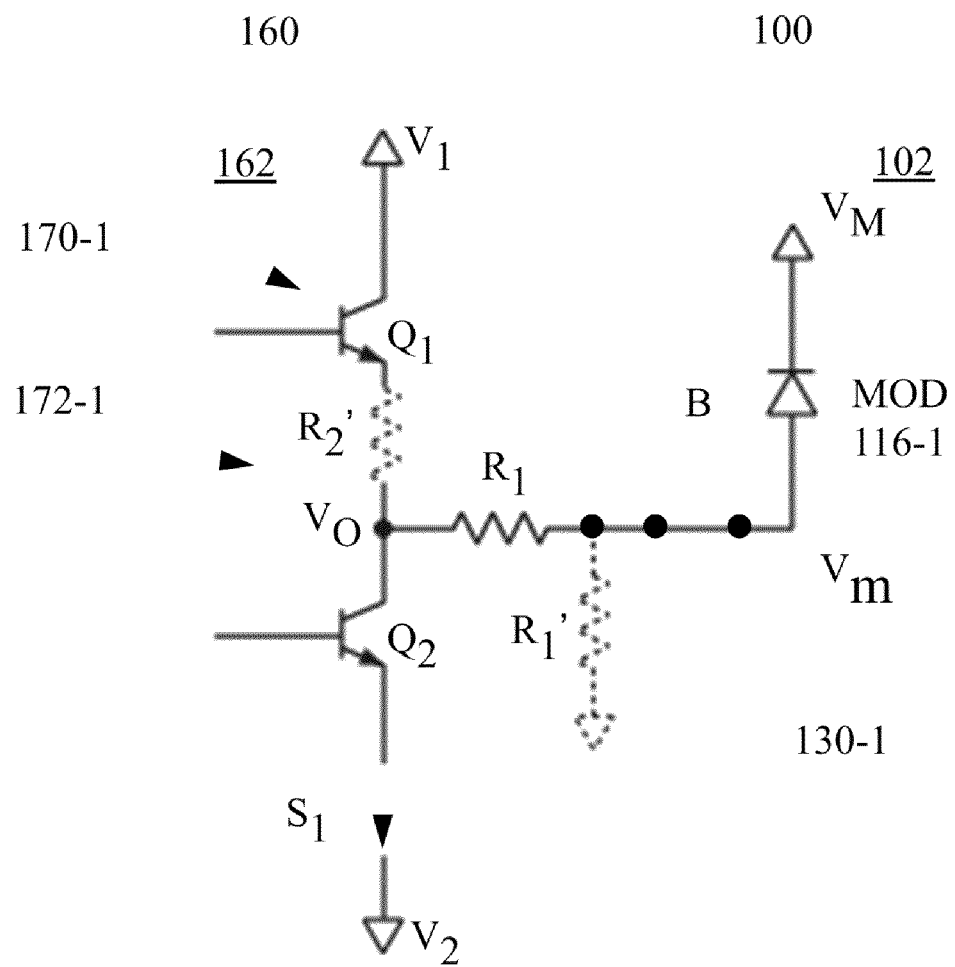
FIG. 7 is another general circuit diagram depicting a modulator driver circuit in accordance with various embodiments of the present invention.

With reference now to FIG. 7, alternative approaches to chirping modulator driver circuitry will be discussed in greater detail. More specifically, FIG. 7 depicts placements of additional electrical components optionally provided in the modulator driver circuit to further adjust or control the modulator drive output signals. For example, the amplitude of a modulator voltage $V_m$, as provided to an electro-optic modulator, can be adjusted through the placement of one or more additional resistors, such as resistors $R_1'$ and $R_2'$ depicted in FIG. 7 in dashed-line. Resistors $R_1'$ and $R_2'$ of FIG. 7 cooperate with the other electrical components of modulator driver circuit 170-1 to provide the proper amplitude, as well as other signal characteristics such as to prevent overshoot for example, of output voltage $V_m$. The corresponding resistance values of $R_1'$ and $R_2'$ of each of the remaining modulator driver circuits 170 may be provided such that a proper modulator output signal $V_m$ is created for, and provided to, the corresponding electro-optic modulator 116-n. Therefore, the array of modulator driver circuits 170 are chirped such that the resistance values of each of the resistors $R_1$, $R_1'$, and $R_2'$ may be different for each modulator driver circuit.

While the various parameters of the chirped electrical components of modulator driver circuitry 170 may be established during a corresponding fabrication process, alternatively the parameters of such electrical components may be modified during operation through the use digital components. For example, the resistor $R_1$ of modulator driver circuit 170-1 may be implemented as a programmable potentiometer, which has a resistance that may be programmed either at the time of fabrication or during operation. A programmable potentiometer, as used herein, is intended to be circuitry comprising one or more electrical components, which, upon receiving one or more inputs provides a desired resistance at a desired location within a circuit, such as the location of resistor $R_1$ of circuit 170-1. The one or more inputs provided to the programmable potentiometer may be provided in the form of voltage signals compatible with the associated substrate. Therefore, for example, if the desired operating parameters of resistor R', e.g. the resistance, of circuit 170-1 are known at the time of fabrication, a programmable potentiometer can be formed upon a substrate common to the modulator driver circuits 170 to provide such resistance.

Another exemplary electrical component which may be optionally provided and chirped, as part of a modulator driver circuit 170-n, is a current source $S_1$ as depicted in FIG. 7 in dashed-line. Current source $S_1$ is coupled to the output stage of the modulator driver circuit 170 and provides a mechanism to adjust the bias current provided to the corresponding electro-optic modulator 116. As should be readily understood by one of ordinary skill in the art, modifying such bias current will also impact the modulator driver circuit output voltage supplied to the electro-optic modulator 116-1 of signal path 110-1, e.g. $V_m$ at the input to modulator 116-1.

As should be readily understood to one of ordinary skill in the art, other electrical components of modulator driver circuits 170 may be chirped, the chirped electrical components having differing values with respect to at least one other modulator driver circuit 170 of the array of such circuits 170-n. Further, the chirping of one or more parameters of such electrical components need not be made in any particular manner or pattern across the array of modulator driver circuits 170. For example, the one or more parameters may be monotonically varied across the array of driver circuits 170. Alternatively, the one or more parameters may be varied across the array of driver circuits 170 to achieve any desired pattern of modulator output signals across the array of driver circuits 170.

While the invention has been described in conjunction with several specific embodiments, it is evident to those skilled in the art that many further alternatives, modifications and variations will be apparent in light of the foregoing description. For example, principals of operation of the modulator driver circuit of this invention may be applied to other circuitry which comprises an array of circuits to interface with arrays of electro-optic devices formed in signal paths. Thus, the invention described herein is intended to embrace all such alternatives, modifications, applications and variations as may fall within the spirit and scope of the appended claims.

What is claimed is:

1. A network device, comprising
a plurality of driver circuits provided on a first substrate;
a plurality of pairs of modulators provided on a second substrate, each of the plurality of pairs of modulators supplying a corresponding one of a plurality of pairs of modulated optical signals;
a plurality of resistors provided on the first substrate, each of the plurality of driver circuits supplying a corresponding one of a plurality of driver signals to a corresponding one of the plurality of resistors, each of the plurality of resistors having a corresponding one of a plurality of resistance values, at least one of the plurality of resistance values being different from the remaining ones of the plurality of resistance values, each of the resistors being coupled to a corresponding one of the plurality of pairs of modulators, such that each of the plurality of driver signals is supplied to a respective one of the plurality of pairs of modulators.

2. A network device in accordance with claim 1, wherein each of the plurality of driver circuits is substantially identical to each other.

3. A network device in accordance with claim 1, wherein each of the plurality of resistance values are different from one another.

4. A network device in accordance with claim 1, wherein a first group of the plurality of resistors has a first resistance value, and a second group of the plurality of resistors has a second resistance value, the first resistor value being different from the second resistor value.

5. A network device in accordance with claim 1, wherein the plurality of resistance values across the plurality of resistors increases from a first of the plurality of resistance values of a first of the plurality of resistors to a last of the plurality of resistance values of a last of the plurality of resistors.

6. A network device in accordance with claim 5, wherein a first group of the plurality of resistors each have the first of the plurality of resistance values and a second group of the plurality of resistors each have the second of the plurality of resistance values.

7. A network device in accordance with claim 1, wherein the plurality of resistance values range from about 5 ohms to about 20 ohms.

8. A network device in accordance with claim 1, wherein the plurality of resistors is a first plurality of resistors, the network device further comprising a second plurality of resistors provided on the first substrate, each of the first plurality of resistors having a first end coupled to a corresponding one of the plurality of driver circuits and a second end, each of the second plurality of resistors having a first end coupled to the second end of a corresponding one of the first plurality of resistors and a second end coupled to a corresponding one of a plurality of voltage values.

9. The network device of claim 8, wherein the plurality of voltage values are substantially the same.

10. A network device, comprising:
a first substrate;
a plurality of driver circuits provided on the first substrate, each of the plurality of driver circuits comprising a plurality electrical components; and
a plurality of pairs of modulators, each of which supplying a corresponding one of a plurality of pairs of optical signals, each of the plurality of driver circuits providing a corresponding one of a plurality of drive signals to a corresponding one of the plurality of pairs of modulators,
wherein a first parameter of a first electrical component of the plurality of electrical components of a first of the plurality of driver circuits is configured to be different from the first parameter of the first electrical component of the plurality of electrical components of a second of the plurality of driver circuits.

11. The network device in accordance with claim 10, wherein the first parameter of the first electrical component of the plurality of electrical components is a resistance value, a capacitance value, an inductance value, or an electrical gain value.

12. The network device in accordance with claim 10, wherein the first parameter of the first electrical component of the plurality of electrical components of the first of the plurality of circuits is configured to be different from the first parameter of the first electrical component of the plurality of electrical components of a third of the plurality of circuits.

13. The network device in accordance with claim 10, wherein the first parameter of the first electrical component of the plurality of electrical components is a resistance value.

14. The network device in accordance with claim 10, wherein the first parameter of the first electrical component of the plurality of electrical components of the first of the plurality of circuits is configured to be substantially the same as the first parameter of the first electrical component of the plurality of electrical components of a fourth of the plurality of circuits.

15. The network device in accordance with claim 14, wherein the first parameter of the first electrical component of the plurality of electrical components is a resistance value.

16. The system in accordance with claim 10, wherein each of the plurality of pairs of modulators is a pair of electro-optic modulators.

17. The system in accordance with claim 10, wherein the first parameter of the first electrical component of the plurality of electrical components is configured to manipulate a characteristic of a corresponding one of the plurality of drive signals of a corresponding one of the plurality of circuits.

18. The system in accordance with claim 17, wherein the characteristic is an output voltage value.

19. The system in accordance with claim 18, wherein the characteristic further comprises a rate of change of the output voltage value.

* * * * *